(12) United States Patent
Maruyama

(10) Patent No.: US 7,436,106 B2
(45) Date of Patent: Oct. 14, 2008

(54) PIEZOELECTRIC DEVICE

(75) Inventor: Yasuo Maruyama, Isehara (JP)

(73) Assignee: Epson Toyocom Corporation, Tokyo (JP)

( * ) Notice: Subject to any disclaimer, the term of this patent is extended or adjusted under 35 U.S.C. 154(b) by 42 days.

(21) Appl. No.: 11/730,901

(22) Filed: Apr. 4, 2007

(65) Prior Publication Data

US 2007/0247029 A1  Oct. 25, 2007

(30) Foreign Application Priority Data

Apr. 25, 2006 (JP) ............................. 2006-120276

(51) Int. Cl.
*H01L 41/053* (2006.01)
(52) U.S. Cl. .................................. 310/348
(58) Field of Classification Search ................ 310/340, 310/344, 348, 365
See application file for complete search history.

(56) References Cited

U.S. PATENT DOCUMENTS 6,917,142 B2 * 7/2005 Koyama et al. ............. 310/344
7,256,659 B2 * 8/2007 Mizumura et al. ............ 331/68
2002/0047501 A1 * 4/2002 Tsuda et al. ................. 310/348

FOREIGN PATENT DOCUMENTS

JP      A 2005-117188        4/2005

* cited by examiner

*Primary Examiner*—Thomas M Dougherty
(74) *Attorney, Agent, or Firm*—Oliff & Berridge, PLC

(57) ABSTRACT

A piezoelectric device includes: a piezoelectric element; a piezoelectric element package containing the piezoelectric element; a connecting terminal disposed on the bottom of the piezoelectric element package; a circuit element connected to the bottom of the piezoelectric element package; a insulating resin portion covering the circuit element; and an external electrode formed on the surface of the resin portion, wherein: in a plan view seen from the direction, along which the external electrode is formed, an inclined portion is provided in a part of an area of the resin portion, in which the external electrode is to be formed, the inclined portion extending from the bottom surface of the piezoelectric element package towards the surface of the resin portion; and the connecting terminal on the bottom of the piezoelectric element package and the external electrode of the resin portion are electrically connected to each other by means of a connecting electrode formed on the inclined portion.

3 Claims, 3 Drawing Sheets

PIEZOELECTRIC DEVICE

BACKGROUND OF THE INVENTION

1. Technical Field

The present invention relates to a piezoelectric device of surface mounting type used in communication devices or electronics.

2. Related Art

To satisfy the demand on the improved portability of communication devices or electronics, those communication devices or electronics have been rapidly downsized. Accordingly, also for piezoelectric devices typified by crystal oscillators used in those communication devices or electronics, the demand of downsize and reduction in height has become increasingly high.

One such example of piezoelectric oscillators downsized and reduced in their height is a crystal oscillator disclosed in JP-A-2005-117188 A (see FIG. 3). The crystal oscillator is described with reference to FIGS. 4A and 4B. FIG. 4A is a schematic sectional view of the crystal oscillator and FIG. 4B is a bottom view of the crystal oscillator.

In this crystal oscillator 50, an IC chip 62 is mounted on the bottom surface of a crystal resonator package 60 containing a crystal resonator element 61. A resin is molded so as to surround the IC chip 62, thereby forming a resin portion 63. A terminal 64 on the bottom surface of the crystal resonator package 60 and an external electrode 65 formed on the resin portion 63 are connected with each other by wiring 66 formed by conductive adhesive. In order to avoid the disconnection at an edge portion after establishing the connection between the terminal 64 and the external electrode 65 by conductive adhesive, a surface, in which the wiring 66 of the resin portion 63 is to be formed, is inclined.

JP-A-2005-117188 A is an example of related art.

However, the resin portion serving as the bottom of the crystal oscillator is inclined, so it is impossible to form the external electrode larger in the case of a downsized crystal oscillator. As a result, there is a fear in that in the case of mounting the crystal oscillator on a circuit substrate or the like the mounting strength of the crystal oscillator to a circuit substrate becomes deteriorated.

SUMMARY

An advantage of the present invention is to provide a piezoelectric device downsized and reduced in its height and having secured mounting strength to a circuit substrate.

A piezoelectric device according to one aspect of the invention includes: a piezoelectric element; a piezoelectric element package containing the piezoelectric element; a connecting terminal disposed on the bottom of the piezoelectric element package; a circuit element connected to the bottom of the piezoelectric element package; a insulating resin portion covering the circuit element; and an external electrode formed on the surface of the resin portion, wherein: in a plan view seen from the direction, along which the external electrode is formed, an inclined portion is provided in a part of an area of the resin portion, in which the external electrode is to be formed, the inclined portion extending from the bottom surface of the piezoelectric element package towards the surface of the resin portion; and the connecting terminal on the bottom of the piezoelectric element package and the external electrode of the resin portion are electrically connected to each other by means of a connecting electrode formed on the inclined portion In this case, the inclined portion is provided in the area of the resin portion where the external electrode is to be formed and the connecting electrode, which connects the connecting terminal on the bottom of the piezoelectric element package and the external electrode of the resin portion, is formed on the inclined portion. As a result, it is possible to create more surface area of the external electrode even if the piezoelectric device becomes downsized. Therefore, in the case of mounting the piezoelectric device on a circuit substrate, it is possible to provide the piezoelectric device downsized and reduced in its height and having satisfactorily secured mounting strength to the circuit substrate.

It is desirable that the connecting electrode be formed by an electrode obtained by applying and fixing conductive ink on the resin portion.

By forming the connecting electrode using conductive ink, it is possible to apply conductive ink at a precise position and in a precise form on the inclined portion formed on the resin portion by using ink jet method or the like, thereby making it possible to provide the piezoelectric device, in which the connecting terminal on the bottom of the piezoelectric element package and the external electrode of the resin portion are securely connected with each other.

It is desirable that the connecting electrode be formed by an electrode obtained by applying and fixing conductive paste on the resin portion.

By forming the connecting electrode using conductive paste, it is possible to apply conductive paste on the inclined portion of the resin portion by printing method or the like while preferable thickness of the conductive paste is secured, thereby making it possible to provide the piezoelectric device, in which the connecting terminal on the bottom of the piezoelectric element package and the external electrode of the resin portion are securely connected with each other.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings. In the following embodiments, a crystal oscillator will be described as an example of a piezoelectric device.

Embodiment

Figure 1A:
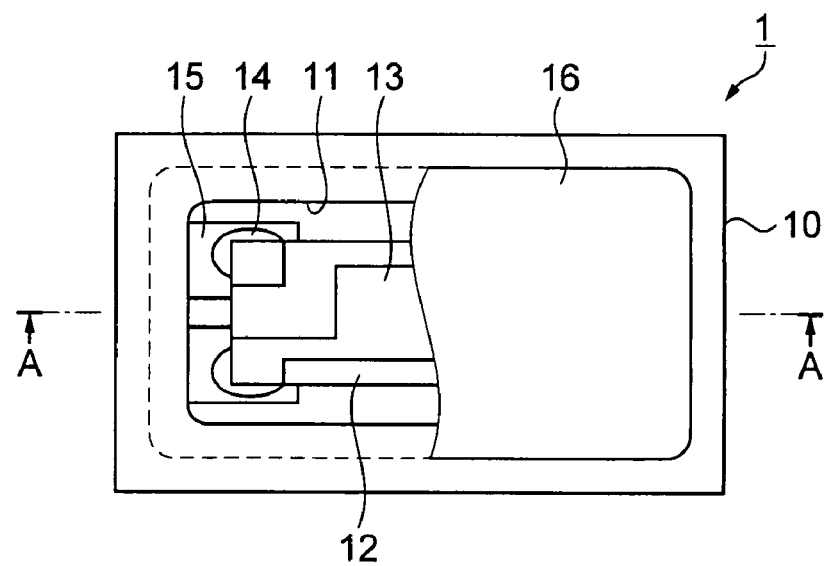
FIG. 1A is a schematic plan view showing the construction of the crystal oscillator according to an embodiment of the invention.
Figure 1B:
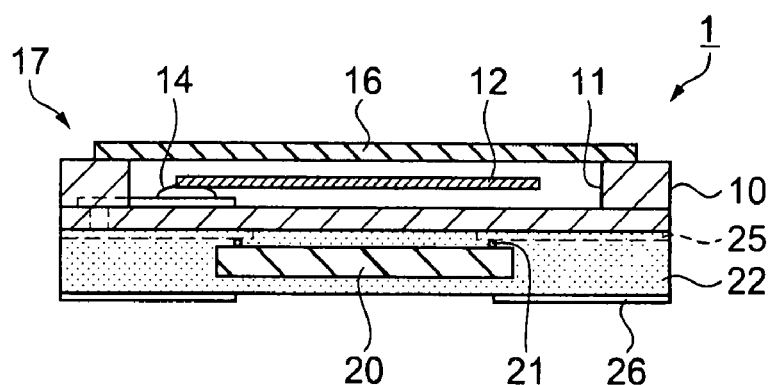
FIG. 1B is a schematic sectional view taken along the line A-A of FIG. 1A.
Figure 1C:
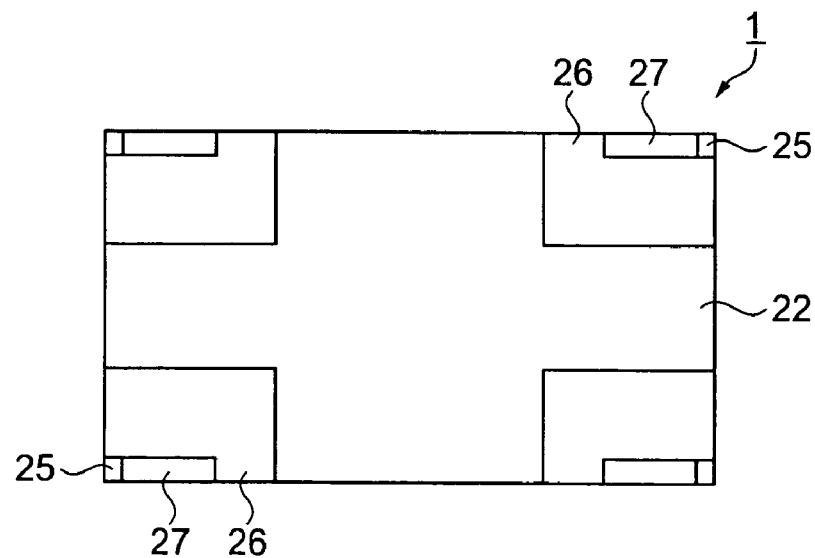
FIG. 1C is a schematic bottom view of crystal oscillator shown in FIG. 1A
Figure 2:
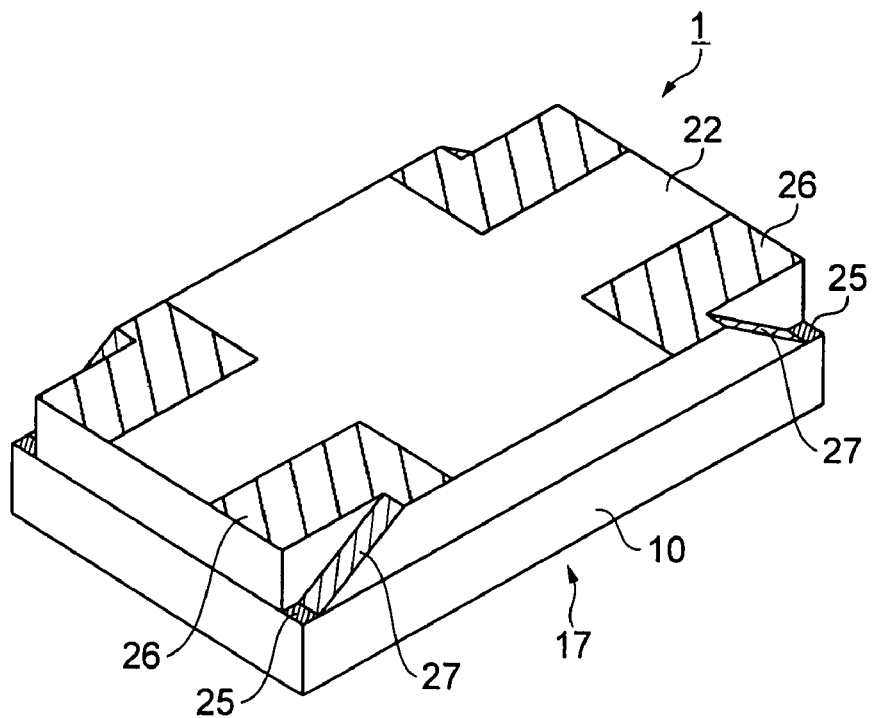
FIG. 2 is a perspective view of the crystal oscillator according to the embodiment of the invention seen from its bottom surface.

FIGS. 1A through 1C each show the construction of the crystal oscillator according to this embodiment of the invention. FIG. 1A shows a schematic plan view, FIG. 1B is a schematic sectional view taken along the line A-A of FIG. 1A, and FIG. 1C is a schematic bottom view. FIG. 2 is a perspective view showing the crystal oscillator of this embodiment from the bottom thereof.

The crystal oscillator 1 has a crystal resonator package 17 containing a crystal resonator element 12, an IC chip 20 mounted on the bottom surface of the crystal resonator package 17, and a resin portion 22 covering the IC chip 20.

In the crystal resonator package 17, the crystal resonator element 12 is fixed in a recess 11 formed in a container 19 made from, for example, ceramics by conductive adhesive 14 such as Ag paste. An excitation electrode 13 is formed on the crystal resonator element 12 and is brought into conduction with a connecting pad 15 formed on the bottom surface of the recess 11 of the container 10 by the conductive adhesive 14. A lid body 16 made from, for example, metal is arranged on the top surface of the container 10 and hermetically seal the inside of the recess 11 of the container 10.

On the bottom surface of the container 10, there are formed a plurality of connecting terminals 15, a part of which is constructed so as to be brought into conduction with the connecting pad 15 formed in the recess 11.

The IC chip 20 to which a bump 21 such as Au is formed is face-down mounted on the connecting terminal 25 formed on the bottom surface of the container 10. The IC chip 20 has an oscillating circuit that excites the crystal resonator element 12 and may have a temperature compensating circuit, a memory circuit or the like.

A resin portion 22 made from an insulating material such as an epoxy resin is formed in the bottom surface of the crystal resonator package 17 so as to cover the IC chip 20. An external electrode 26 that establishes connection to an external substrate or the like is formed on the surface of the epoxy portion 22 by printing or the like.

Further, as shown in FIG. 1C, in the plan view seen from the direction in which the external electrode 26, the four corners of the bottom surface serve as areas in which each of the external electrode 26 is formed. At a part of each of the resin portion 22 at those four areas, there is formed an inclined portion towards the surface of the resin portion 22 from the bottom surface of the crystal resonator package 17. The resin portion 22 forms such that a part of the connecting terminal 25 formed in the bottom surface of the crystal resonator package 17 is exposed. The inclined portion starts from the exposed part of the connecting terminal 25.

Conductive ink is applied to the inclined portion by ink jet method or the like, thereby forming a connecting electrode 27 fixed on the resin portion 22. As thus described, as shown in FIG. 2, the connecting terminal 25 on the bottom portion of the crystal resonator package 17 and the external electrode 26 of the resin portion 22 are connected to each other by the connecting electrode 27, thereby establishing electrical connection.

Note that as a material forming the connecting electrode 27 at the inclined portion of the resin portion 22 a conductive paste may be applied by printing method or the like so as to be fixed on the resin portion 22, thereby forming the connecting electrode 26.

Further, both of the connecting electrode 27 and the external electrode 26 may be respectively formed on the resin portion 22 by applying conductive ink using ink jet method.

In this case, the ink jet method is more advantageous than the printing method because even a fine electrode, which is hardly formed by the printing method, can be formed by the ink jet method.

That is to say, in the case of using the printing method, smaller the bores of the mask for printing, harder it becomes to transfer a conductive paste to the bottom portion of the crystal resonator package 17 due to influence of the surface tension of the conductive paste against the mask. On the contrary, the ink jet method utilizes no mask and is therefore more advantageous in the case of forming a fine electrode.

As described above, in the crystal oscillator 1 according to this embodiment, an inclined portion is formed on a part of the area forming the external electrode 26 of the resin portion 22 and the connecting electrode 27 is formed on the inclined portion, thereby connecting the connecting electrode 25 on the bottom portion of the crystal resonator package 17 and the external electrode 26 to each other. By this, there is provided a structure in which the connecting terminal 25 and the external electrode 26 are electrically connected to each other. As thus described above, even if the size of the crystal oscillator 1 becomes smaller, it is possible to provide a large surface area of the external electrode 26 facing a mounting surface of the circuit substrate, on which the crystal oscillator 1 is to be mounted, thereby making it possible to ensure sufficient mounting strength in the case of mounting to the circuit substrate. Further, it is possible to provide the crystal oscillator 1 downsized and reduced in its height by using the structure according to this embodiment.

Furthermore, when the connecting electrode 27 is formed by using conductive ink, it becomes possible to easily apply conductive ink at a precise position and in a precise to the inclined portion formed on the resin portion 22 by using ink jet method or the like, thereby making it possible to provide the crystal oscillator 1 in which the connecting terminal 25 on the bottom of the crystal resonator package 17 and the external electrode 26 of the resin portion 22 are reliably connected with each other.

Further, it is also possible to form the connecting electrode 27 by using conductive paste, easily applying conductive paste to the inclined portion formed on the resin portion 22 by printing while securing satisfactory thickness of conductive paste, thereby making it possible to provide the crystal oscillator 1 in which the connecting terminal 25 on the bottom of the crystal resonator package 17 and the external electrode 26 of the resin portion 22 are reliably connected with each other.

(Modification)

Next, a modification of the crystal oscillator of the above-described embodiment of the invention will be described. This modification is characterized by the form of a resin portion, so the construction of this resin portion will be described in details.

Figure 3:
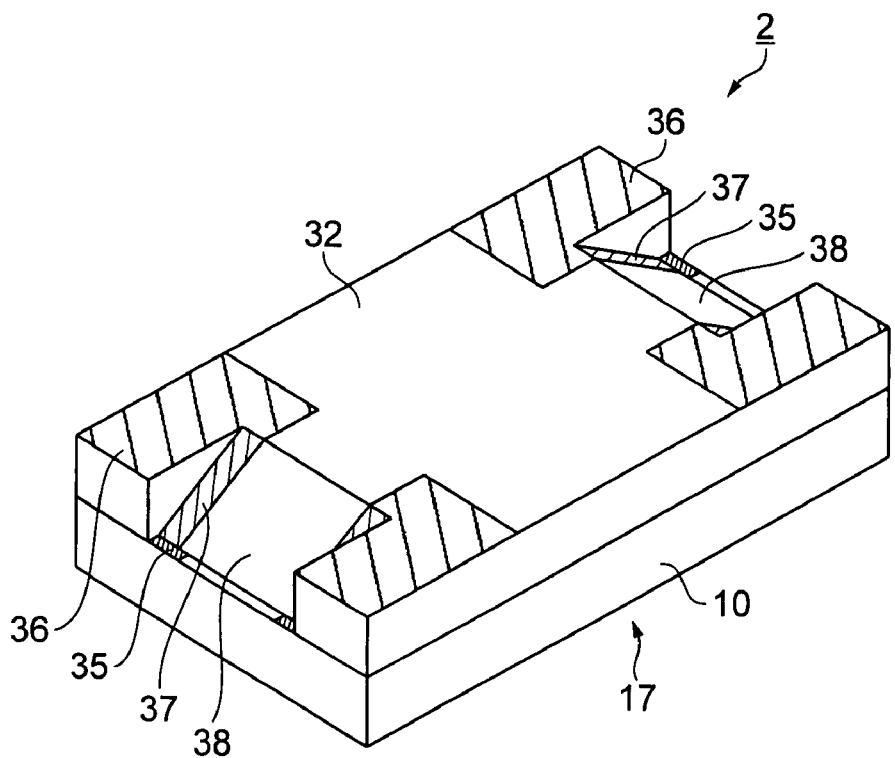
FIG. 3 is a perspective view of the crystal oscillator according to a modification of the embodiment of the invention seen from its bottom surface.
Figure 4A:
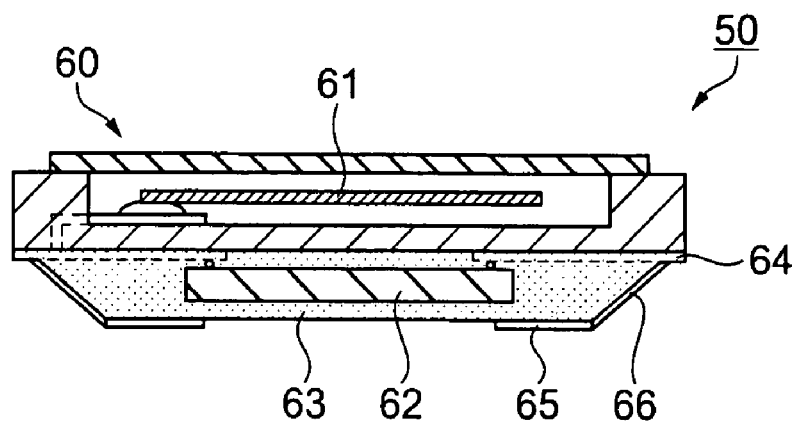
FIG. 4A is a schematic sectional view showing the construction of a conventional crystal oscillator.
Figure 4B:
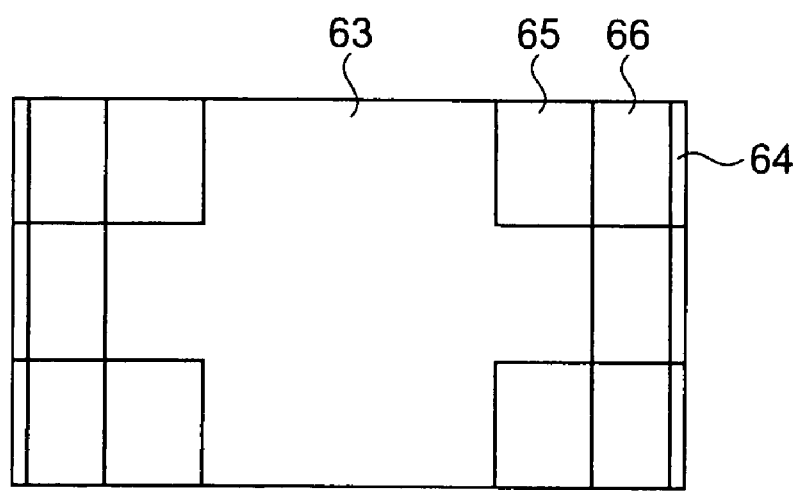
FIG. 4B is a perspective bottom view showing the construction of the conventional crystal oscillator of FIG. 4A.

FIG. 3 is a perspective view showing a crystal oscillator according to this modification seen from the bottom thereof.

In a crystal oscillator 2, a resin portion 32 is formed on the bottom of the crystal resonator package 17, and an IC chip is arranged inside the resin portion 32. On the surface of the resin portion 32, there is formed by printing or the like an external terminal 36 that establishes connection to an external substrate or the like.

In a plan view seen in the direction, along which the external electrode 36 is formed, four corners of the bottom surface are areas, in which each external electrode 36 is to be formed. In the substantially central portion of each of two opposite shorter sides of the resin portion 32, there is formed an inclined portion 38 partially covering a part of the area, in which each external electrode is to be formed. The inclined portion 38 is formed so as to extend towards the surface of the resin portion 32 from the bottom surface of the crystal resonator package 17.

Note that the resin portion 32 is formed in a manner that a part of the connecting terminal 35 formed on the bottom surface of the crystal resonator package 17 is exposed. The inclined portion 38 starts from this exposed portion of the connecting terminal 35.

Conductive ink is applied by using ink jet method or the like to the inclined portion 38 covering a part of the area, in which the external electrode 36 is to be formed, thereby forming a connecting electrode 37 fixed on the resin portion 32. As thus described above, a connecting terminal 35 on the bottom of the crystal package 17 and the external electrode 36 of the resin portion 32 are electrically connected with each other by means of the connecting electrode 37.

Note that conductive paste may be used as materials for forming the connecting electrode 37 on the inclined portion of the resin portion 32 and applied thereto by printing method or the like so as to be fixed on the resin portion 32, thereby forming the connecting electrode 37.

Further, both of the connecting electrode 37 and the external electrode 36 may be formed by applying conductive ink on the resin portion 32 by using ink jet method or the like.

As thus described above, according to this modification of the invention, it is possible to obtain the same effects as of the above-mentioned embodiment, thereby making it possible to provide the crystal oscillator 2 downsized and reduced in its height.

As thus described above, in the above-described embodiment, a crystal oscillator utilizing a crystal resonator element as a piezoelectric device is exemplified. However, it should not be construed restrictively; As materials for resonator elements, the piezoelectric resonator element utilizing a piezoelectric material such as lithium tantalate or lithium niobate may be used.

Further, it is possible to use as a piezoelectric element instead of a crystal resonator element a SAW oscillator utilizing a surface acoustic wave (SAW) device or a vibrating gyroscope sensor utilizing a vibrating gyroscope device or the like may also be used und the same effects can be obtained as in the case of this embodiment of the invention.

What is claimed is:

1. A piezoelectric device, comprising:
    a piezoelectric element;
    a piezoelectric element package containing the piezoelectric element;
    a connecting terminal disposed on the bottom of the piezoelectric element package;
    a circuit element connected to the bottom of the piezoelectric element package;
    a insulating resin portion covering the circuit element; and
    an external electrode formed on the surface of the resin portion, wherein:
    in a plan view from the direction along which the external electrode is formed, an inclined portion is provided in a part of an area of the resin portion, in which the external electrode is to be formed, the inclined portion extending from the bottom surface of the piezoelectric element package towards the surface of the resin portion; and
    the connecting terminal on the bottom of the piezoelectric element package and the external electrode of the resin portion are electrically connected to each other by means of a connecting electrode formed on the inclined portion.

2. The piezoelectric device according to claim 1, the connecting electrode being formed by an electrode obtained by applying and fixing conductive ink on the resin portion.

3. The piezoelectric device according to claim 1, the connecting electrode being formed by an electrode obtained by applying and fixing conductive paste on the resin portion.

* * * * *